(12) United States Patent
Chen et al.

(10) Patent No.: US 7,671,421 B2
(45) Date of Patent: Mar. 2, 2010

(54) CMOS STRUCTURE AND METHOD FOR FABRICATION THEREOF USING MULTIPLE CRYSTALLOGRAPHIC ORIENTATIONS AND GATE MATERIALS

(75) Inventors: Tze-Chiang Chen, Yorktown Heights, NY (US); Meikei Ieong, Wappingers Falls, NY (US); Rajarao Jammy, Hopewell Junction, NY (US); Mukesh V. Khare, White Plains, NY (US); Chun-yung Sung, Poughkeepsie, NY (US); Richard Wise, Newburgh, NY (US); Hongwen Yan, Somers, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/444,011

(22) Filed: May 31, 2006

(65) Prior Publication Data
US 2007/0278586 A1    Dec. 6, 2007

(51) Int. Cl.
*H01L 21/00* (2006.01)
(52) U.S. Cl. .................. 257/369; 257/351; 257/64; 257/628; 257/E29.003
(58) Field of Classification Search ............. 257/369, 257/E29.126, 64, 628, E29.003, 351; 438/199
See application file for complete search history.

(56) References Cited

U.S. PATENT DOCUMENTS

| | | | |
|---|---|---|---|
| 6,410,938 B1* | 6/2002 | Xiang | 257/49 |
| 6,600,212 B2* | 7/2003 | Takayanagi et al. | 257/616 |
| 6,686,282 B1* | 2/2004 | Simpson et al. | 438/685 |
| 6,902,962 B2* | 6/2005 | Yeo et al. | 438/150 |
| 6,911,379 B2* | 6/2005 | Yeo et al. | 438/480 |
| 7,030,001 B2* | 4/2006 | Adetutu et al. | 438/585 |
| 7,033,893 B1* | 4/2006 | Xiang | 438/275 |
| 7,354,814 B2* | 4/2008 | Orlowski et al. | 438/199 |
| 2005/0001290 A1* | 1/2005 | Chan et al. | 257/627 |
| 2005/0258468 A1 | 11/2005 | Colombo et al. | |
| 2006/0113603 A1* | 6/2006 | Currie | 257/368 |
| 2006/0226470 A1* | 10/2006 | Cho et al. | 257/315 |
| 2007/0018259 A1* | 1/2007 | Ko et al. | 257/410 |
| 2007/0228480 A1* | 10/2007 | Yen et al. | 257/369 |
| 2007/0262399 A1* | 11/2007 | Dewey et al. | 257/410 |

* cited by examiner

*Primary Examiner*—Eugene Lee
(74) *Attorney, Agent, or Firm*—Scully, Scott, Murphy & Presser, P.C.; Daniel P. Morris, Esq.

(57) ABSTRACT

Methods for fabricating a CMOS structure use a first gate stack located over a first orientation region of a semiconductor substrate. A second gate material layer is located over the first gate stack and a laterally adjacent second orientation region of the semiconductor substrate. A planarizing layer is located upon the second gate material layer. The planarizing layer and the second gate material layer are non-selectively etched to form a second gate stack that approximates the height of the first gate stack. An etch stop layer may also be formed upon the first gate stack. The resulting CMOS structure may comprise different gate dielectrics, metal gates and silicon gates.

13 Claims, 6 Drawing Sheets

CMOS STRUCTURE AND METHOD FOR FABRICATION THEREOF USING MULTIPLE CRYSTALLOGRAPHIC ORIENTATIONS AND GATE MATERIALS

BACKGROUND

1. Field of the Invention

The invention relates generally to methods for fabricating complementary metal oxide semiconductor (CMOS) structures. More particularly, the invention relates to methods for fabricating CMOS structures with enhanced performance.

2. Description of the Related Art

Complementary metal oxide semiconductor (CMOS) structures comprise mated pairs of complementary conductivity type (i.e., typically n and p conductivity type, or dopant polarity) field effect transistors. CMOS structures are desirable insofar as the complementary conductivity types provide for reduced power consumption when operating CMOS devices.

Although CMOS structures are readily fabricated, modern generations of CMOS structures nonetheless suffer within the context of CMOS device optimization. In particular, materials of composition of individual CMOS field effect transistor components may often considerably influence CMOS field effect transistor operating parameters. Materials of composition that are of particular concern include semiconductor substrate composition and crystallographic orientation, and gate electrode layering structure and materials of composition.

Semiconductor substrate compositions and crystallographic orientations influence carrier mobility within CMOS devices. Gate electrode compositions affect depletion effects and work functions within CMOS gates.

CMOS structures continue to be prevalent within current and anticipated generations of semiconductor technology. Thus, a need continues to exist for fabricating CMOS structures with enhanced performance.

SUMMARY OF THE INVENTION

The invention includes CMOS structures and methods for fabricating CMOS structures.

A particular CMOS structure in accordance with the invention includes complementary transistors that may be fabricated using different materials compositions for a semiconductor channel, gate dielectric, metal gate and overlying polysilicon gate.

Methods for fabricating CMOS structures in accordance with the invention include a non-selective etch step for etching a planarizing layer and a second silicon gate material layer to provide an etched second silicon gate material layer having a height approximating a first silicon gate material layer.

A CMOS structure in accordance with the invention includes a first transistor located within a semiconductor substrate. The first transistor includes a first orientation surface semiconductor layer, a first gate dielectric located thereupon, a first metal gate located thereupon and a first silicon gate located thereupon. This particular CMOS structure. also includes a second transistor located within the semiconductor substrate. The second transistor includes a second orientation surface semiconductor layer different than the first orientation surface semiconductor layer, a second gate dielectric located thereupon, a second metal gate located thereupon and a second silicon gate located thereupon.

A method in accordance with the invention includes forming a first gate stack upon a first region of a semiconductor substrate. The first gate stack includes an upper first gate material layer. This particular method also includes forming a second gate material layer upon the first gate stack and a laterally adjacent second region of the semiconductor substrate. This particular method also includes forming a planarizing layer upon the second gate material layer and non-selectively etching the planarizing layer and the second gate material layer to form a second gate stack laterally adjacent the first gate stack and approximating the height of the first gate stack.

Another method in accordance with the invention includes forming a first gate stack upon a first region of a semiconductor substrate. The first gate stack comprises an upper first silicon gate material layer. This other method also includes forming a second silicon gate material layer upon the first gate stack and a laterally adjacent second region of the semiconductor substrate. This other method also includes forming a planarizing layer upon the second silicon gate material layer and non-selectively etching the planarizing layer and the second silicon gate material layer to form a second gate stack laterally adjacent the first gate stack and approximating the height of the first gate stack.

Yet another method in accordance with the invention includes forming a first gate stack upon a first region of a semiconductor substrate. The first gate stack comprises an upper first silicon gate material layer and an etch stop layer located thereupon. This particular method also includes forming a second silicon gate material layer upon the first gate stack and a laterally adjacent second region of the semiconductor substrate. This particular method also includes forming a planarizing layer upon the second silicon gate material layer and non-selectively etching the planarizing layer and the second silicon gate material layer to form a second gate stack laterally adjacent the first gate stack and approximating the height of the first gate stack, while using the etch stop layer as an etch indicator layer.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The invention, which comprises CMOS structures and methods for fabricating CMOS structures, is described in further detail below within the context of the drawings described above. Since the drawings are provided for illustrative purposes, the drawings are not necessarily drawn to scale.

FIG. 1 to FIG. 7 show a series of schematic cross-sectional diagrams illustrating the results of progressive stages in fabricating a CMOS structure in accordance with a first embodiment of the invention.

Figure 1:
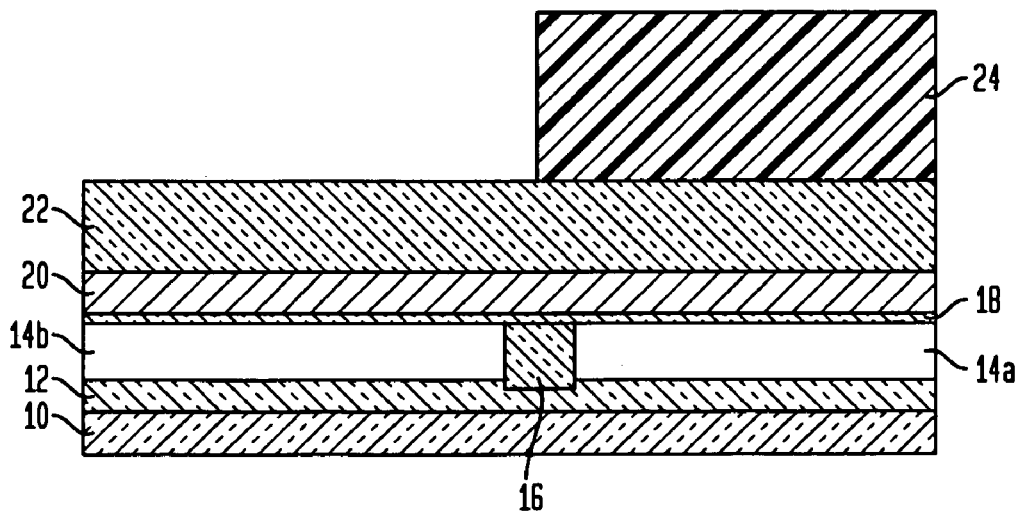
FIG. 1 to FIG. 7 show a series of schematic cross-sectional diagrams illustrating the results of progressive stages in fabricating a CMOS structure in accordance with an embodiment of the invention.

FIG. 1 shows a schematic cross-sectional diagram of a CMOS structure at an early stage in the fabrication thererof. Specifically, FIG. 1 shows a substrate 10 having a buried dielectric layer 12 located thereupon. A first orientation surface semiconductor surface layer 14a (i.e., a first crystallographic orientation surface semiconductor layer) and a second orientation surface semiconductor layer 14b (i.e., a second crystallographic orientation surface semiconductor layer) are located upon the buried dielectric layer 12 and are separated by an isolation region 16 that is also located upon the buried dielectric layer 12. The foregoing substrate 10, buried dielectric layer 12, oriented surface semiconductor layers 14a and 14b and isolation region 16 may comprise materials and have dimensions that are otherwise generally conventional in the semiconductor fabrication art. The foregoing substrate 10, layers 12, 14a and 14b, and structure 16 may also be formed using methods that are conventional in the semiconductor fabrication art.

The substrate 10 is typically a semiconductor substrate, although the invention is not intended to be so limited. Thus, the substrate may alternatively comprise a dielectric material or a conductor material. Non-limiting examples of semiconductor materials from which may be comprised the substrate 10 include, silicon, germanium, silicon-germanium alloy, silicon carbide, silicon-germanium carbide and compound semiconductor materials. Non-limiting examples of compound semiconductor materials include gallium arsenide, indium arsenide and indium phosphide semiconductor materials.

The buried dielectric layer 12 comprises a dielectric material. Non-limiting examples of dielectric materials include oxides, nitrides and oxynitrides of silicon. Oxides, nitrides and oxynitrides of other elements are not excluded. The dielectric material may be formed using any of several methods. Non-limiting examples include thermal or plasma oxidation or nitridation methods, chemical vapor deposition methods and physical vapor deposition methods. Typically, the buried dielectric layer 12 comprises a silicon oxide dielectric material that has a thickness from about 100 to about 300 angstroms.

The first orientation surface semiconductor layer 14a and the second orientation surface semiconductor layer 14b may each independently comprise a semiconductor material selected from the group of semiconductor materials disclosed above from which may be comprised the substrate 10. Thus, the first orientation surface semiconductor layer 14a and the second orientation surface semiconductor layer 14b may comprise either the same or different semiconductor materials. Nonetheless, the first orientation surface semiconductor layer 14a and the second orientation surface semiconductor layer 14b will comprise different crystallographic orientations that are desirable for forming CMOS transistors within the semiconductor structure whose schematic cross-sectional diagram is illustrated in FIG. 1. The first orientation surface semiconductor layer 14a and the second orientation surface semiconductor layer 14b may be formed of different crystallographic orientations using selective epitaxial growth methods and selective crystallographically specific layer lamination methods. Alternative methods that yield appropriate crystallographic specificity to the first orientation surface semiconductor layer 14a and the second orientation surface semiconductor layer 14b are not excluded.

Typically, for a silicon or a silicon-germanium alloy semiconductor material, a (100) crystallographic orientations is desirable for an nFET and a (110) crystallographic orientation is desirable for a pFET. The invention is not, however, limited to the foregoing two crystallographic orientations for fabricating CMOS transistors. Rather, a person skilled in the art may readily discern alternative workable crystallographic orientation pairs suitable for complimentary doped CMOS field effect transistor pairs.

The isolation region 16 will typically comprise a dielectric isolation material that is otherwise generally conventional in the semiconductor fabrication art. The isolation region 16 may comprise the same dielectric materials that are disclosed above for the buried dielectric layer 12. Typically, the isolation region 16 reaches the buried dielectric layer 12 so that the first orientation surface semiconductor layer 14a and the second orientation surface semiconductor layer 14b are completely isolated.

FIG. 1 also shows a first gate dielectric 18 located upon the first orientation surface semiconductor layer 14a, the second orientation surface semiconductor layer 14b and the isolation region 16. A first metal gate material layer 20 is located upon the first gate dielectric 18. A first silicon gate material layer 22 is located upon the first metal gate material layer 20. A first block mask 24 is located upon the first silicon gate material layer 22. and covering the first orientation surface semiconductor layer 14a, but not the second orientation surface semiconductor layer 14b.

The first gate dielectric 18 may comprise any of several gate dielectric materials that are conventional in the semiconductor fabrication art. The first gate dielectric 18 may comprise generally lower dielectric constant gate dielectric materials having a dielectric constant from about 4 to about 20, measured in a vacuum. Non-limiting examples of such gate dielectric materials include oxides, nitride and oxynitrides of silicon. Oxides, nitrides and oxynitrides of other elements are not excluded. The first gate dielectric 18 may also comprise generally higher dielectric constant gate dielectric materials having a dielectric constant from 20 to at least about 100. Non-limiting examples of such dielectric materials include hafnium oxides, hafnium silicates, titanium oxides, lanthanum oxides, barium-strontium titanates (BSTs) and lead-zirconate titanates (PZTs). The first gate dielectric 18 may be formed using methods appropriate to the materials of composition thereof. Non-limiting examples of such methods include thermal or plasma oxidation or nitridation methods, chemical vapor deposition methods (including atomic layer chemical vapor deposition methods) and physical vapor deposition methods (including sputtering methods).

Typically, the first gate dielectric 18 comprises a hafnium oxide based dielectric material (i.e., also including a hafnium silicate dielectric material) having a thickness from about 20 to about 50 angstroms.

The first metal gate material layer 20 comprises a metal gate material. Non-limiting examples of metal gate materials include non-refractory metals as well as refractory metals. Specific and non-limiting examples include ruthenium, rhodium, platinum, palladium, copper, aluminum, tungsten, titanium, tantalum and vanadium metals, as well as alloys thereof and nitrides thereof. The first metal gate material layer 20 maybe deposited using any of several methods. Non-limiting examples include plating methods, chemical vapor deposition methods (including atomic layer chemical vapor deposition methods) and physical vapor deposition methods (including sputtering methods). Typically, the first metal gate material layer 20 comprises a titanium nitride metal gate material that has a thickness from about 20 to about 300 angstroms.

The first silicon gate material layer 22 comprises a silicon material. Non-limiting examples of silicon materials include amorphous silicon materials, polysilicon materials and related silicon-germanium alloy materials. The silicon materials may be deposited using methods including, but not limited to: chemical vapor deposition methods and physical vapor deposition methods. Typically, the first silicon gate material layer 22 comprises a polysilicon material having an appropriate dopant concentration and conductivity type, and also having a thickness from about 500 to about 1000 angstroms.

Finally, the first block mask 24 may comprise a hard mask material and/or a photoresist mask material. Photoresist mask materials are considerably more common. Non-limiting examples of photoresist materials include positive photoresist materials, negative photoresist materials and hybrid photoresist materials. Typically, the first block mask 24 comprises a photoresist material having a thickness from about 2000 to about 10000 angstroms.

Figure 2:
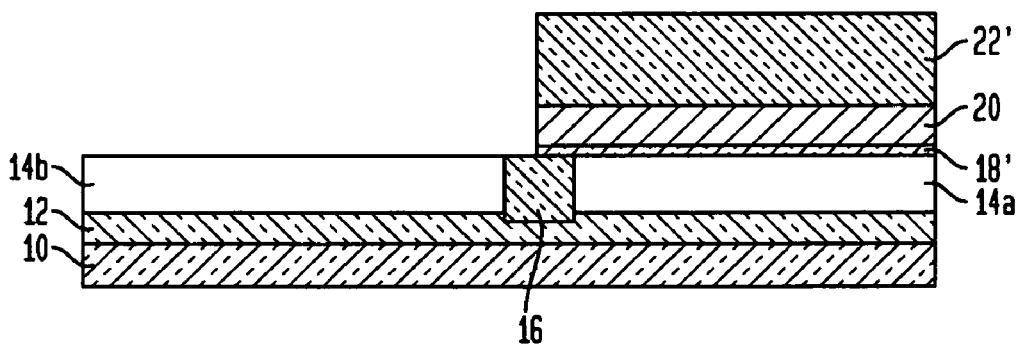

FIG. 2 shows the results of sequentially etching and patterning the first silicon gate material layer 22, the first metal gate material layer 20 and the first gate dielectric 18 to form a corresponding first silicon gate material layer 22', first metal gate material layer 20' and first gate dielectric 18'. The foregoing patterning is effected using the first block mask 24 as an etch mask, while also using an anisotropic etch method that preferably provides generally straight sidewalls to the first silicon gate material layer 22', the first metal gate material layer 20' and the first gate dielectric 18'. Under certain alternative circumstances, a wet chemical etch method may also be used. Typically, the plasma etch method uses a fluorine containing etchant gas composition for etching silicon containing dielectric materials and some metal gate materials. Typically, the plasma etch method uses a chlorine containing etchant gas composition for etching some other metal gate materials and silicon gate materials.

FIG. 2 also shows the results of stripping the first block mask 24 after patterning the first silicon gate material layer 22', the first metal gate material layer 20' and the first gate dielectric 18'. The first block mask 24 may stripped using methods and materials that are conventional in the semiconductor fabrication art. When the first block mask 24 comprises a photoresist material, the first block mask 24 may be stripped using methods including, but not limited to: wet chemical stripping methods, dry plasma stripping methods aggregate stripping methods thererof.

Figure 3:
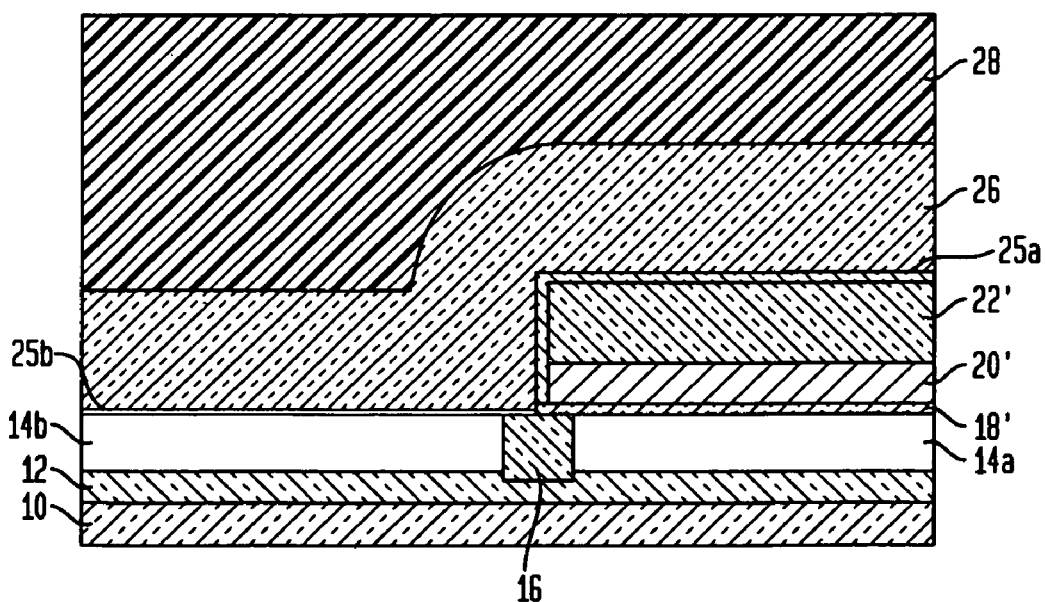

FIG. 3 shows a second gate dielectric 25b located upon the second orientation surface semiconductor layer 14b and an etch stop layer 25a located upon exposed portions of the first silicon gate material layer 22', the first metal gate material layer 20' and the first gate dielectric 18'. The second gate dielectric 25b and the etch stop layer 25a may comprise the same or related materials that are either directly deposited or thermally grown. They may be deposited using methods that are used for the first gate dielectric 18 that is illustrated in FIG. 1. Oxides, nitrides and oxynitrides of silicon are common materials for both the second gate dielectric 25b and the etch stop layer 25a. Typically, the second gate dielectric 25b and the etch stop layer 25a comprise a silicon oxynitride material that has a thickness from about 20 to about 70 angstroms. The second gate dielectric 25a and the etch stop layer 25b may be formed using a thermal oxidation and nitridation method or a plasma oxidation and nitridation method.

FIG. 3 also shows a second silicon gate material layer 26 located upon the second gate dielectric 25a and the etch stop layer 25b. The second silicon gate material layer 26 is otherwise generally analogous with the first silicon gate material layer 22', but rather is deposited with a thickness equal to, or greater than, the thicknesses of the first gate dielectric 18', the first metal gate material layer 20' and the first silicon gate material layer 22. Thus, the second silicon gate material layer 26 typically has a thickness from about 600 to about 800 angstroms. The second silicon gate material layer 26 will typically have a different doping concentration and possibly conductivity type so that specific gate work functions may be engineered for a transistor located with the first orientation surface semiconductor layer 14a as a channel in comparison with the second orientation surface semiconductor layer 14b as a channel.

Finally, FIG. 3 also shows a planarizing layer 28 located upon the second silicon gate material layer 26. The planarizing layer 28 may comprise any of several planarizing materials. Non-limiting examples include photoresist planarizing materials, other non-reactive organic polymer planarizing materials and spin-on-glass planarizing materials. Organic polymer planarizing materials and photoresist planarizing materials are most common. The planarizing layer 28 is typically formed using spin coating methods, although vapor deposition methods are not excluded. Typically, the planarizng layer 28 comprises an organic polymer planarizing material or a photoresist planarizing material having a thickness from about 2000 to about 3000 angstroms, in order to fully planarize the second silicon gate material layer 26.

Figure 4:
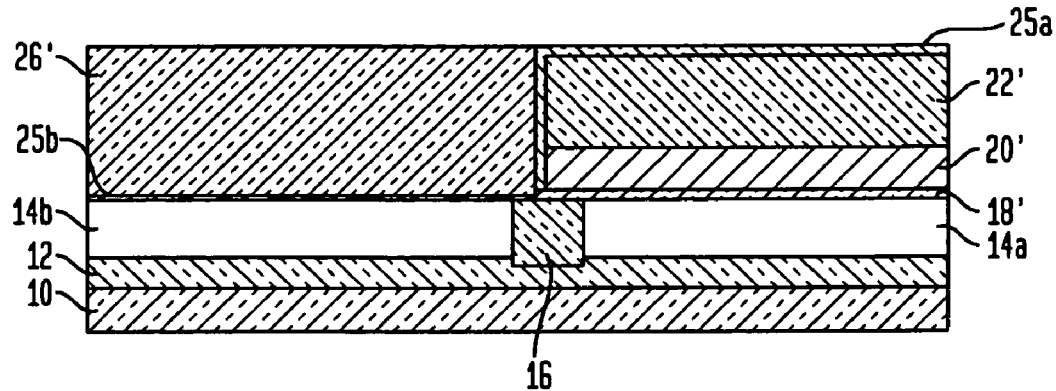

FIG. 4 shows the results of etching back the planarizing layer 28 and the second silicon gate material layer 26 to form a second silicon gate material layer 26' that is nominally and preferably co-planar with the first silicon gate material layer 22' (i.e., nominally co-planar is intended to be within about 10 to about 50 angstroms of a true co-planarity). Thus, within the instant embodiment, the etch stop layer 25a serves as an etchback indicator layer when non-selectively etching the planarizing layer 28 and the second silicon gate material layer 26 to form the second silicon gate material layer 26'.

Within the context of the instant embodiment, the etching back uses a plasma etch method that comprises an etchant gas composition that is engineered to non-selectively etch (i.e., non-selectively etch is intended to indicate an etch ratio for pertinent non-selective materials within about 25% of a 1:1 etch rate ratio) the planarizing layer 28 with respect to the second silicon gate material layer 26. Within the first embodiment, such an etchant gas composition may comprise a mixture of $SF_6$, $NF_3$, $Cl_2$, $O_2$ and $N_2$. The fluorine and chlorine containing components are used to etch the silicon material from which is comprised the second silicon gate material layer 26. The nitrogen and oxygen components are used to etch the organic polymer or photoresist material from which is preferably comprised the planarizing layer 28. The instant embodiment and the invention are not limited to a non-selective plasma etch method. Alternatively a non-selective wet chemical etch method may also be used, but such compositions are often more difficult to effectively engineer.

Preferably, the non-selective plasma etch method uses: (1) a reactor chamber pressure from about 0.1 to about 0.5 torr; (2) a source radio frequency power from about 500 to about 900 watts; (3) a bias power from about 0 to about 30 watts; (4) a substrate 10 temperature from about 40° to about 90° C.; (5) an $SF_6$ flow rate from about 80 to about 230 sccm; (6) an $CF_4$ flow rate from about 100 to about 300 sccm; (7) an oxygen flow rate from about 50 to about 200 sccm; and (8) a nitrogen flow rate from about 30 to about 100 sccm.

Figure 5:
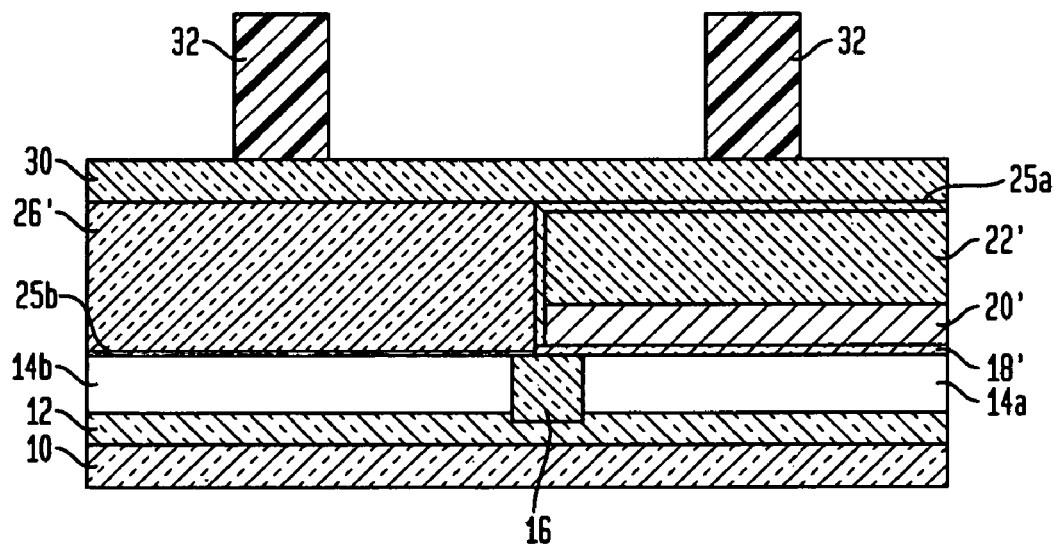

FIG. 5 shows an anti-reflective coating layer 30 located upon the semiconductor structure of FIG. 4. FIG. 5 also shows photoresist layers 32 located upon the anti-reflective coating layer 30 and nominally centered above the first orientation surface semiconductor layer 14a and the second orientation surface semiconductor layer 14b.

The anti-reflective coating layer 30 comprises an anti-reflective coating material. Non-limiting examples of anti-reflective coating materials include: (1) oxides, nitrides and oxynitrides of several elements, including silicon; as well as (2) some organic polymers. The foregoing anti-reflective coating materials may be deposited using methods that are appropriate to their materials of composition. Non-limiting examples include spin-coating methods, chemical vapor deposition methods and physical vapor deposition methods. Typically, the anti-reflective coating layer 30 comprises an organic polymer anti-reflective coating material that has a thickness from about 200 to about 300 angstroms.

The photoresist layers 32 may comprise photoresist materials, analogous, equivalent or identical to the photoresist materials used in the first block mask 24 that is illustrated in FIG. 1. Thickness dimensions and linewidth dimensions of the photoresist layers 32 will generally differ in comparison with thickness and linewidth dimensions of the first block mask 24. The photoresist layers 32 are intended for patterning gate electrodes.

Figure 6:
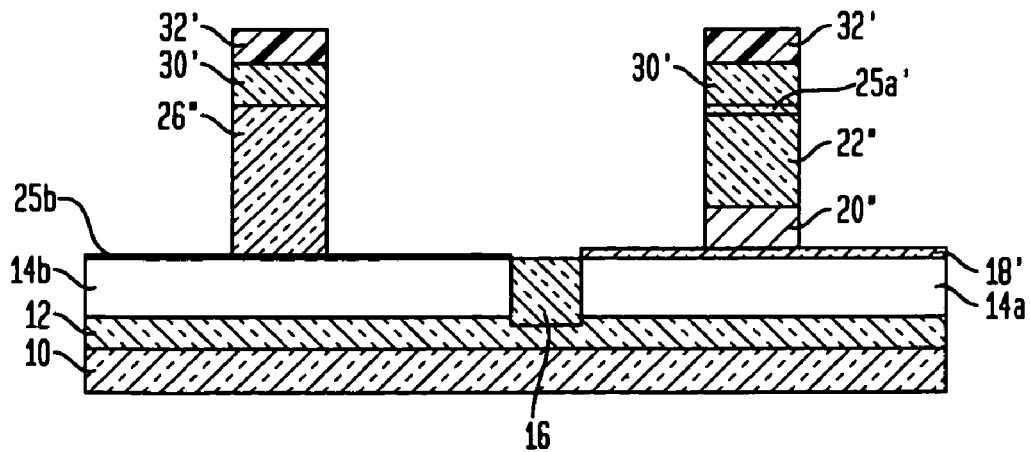

FIG. 6 shows the results of sequentially patterning: (1) the anti-reflective coating layer 30 and the second silicon gate material layer 26'; and (2) the anti-reflective coating layer 30, the etch stop layer 25a, first silicon gate material layer 22' and the first metal gate material layer 20'to form: (1) a first gate stack comprising, from top to bottom, a photoresist layer 32', an anti-reflective coating layer 30', an etch stop layer 25a', a silicon gate 22" and a metal gate 20"located upon the first gate dielectric 18'; and (2) a second gate stack comprising, from top to bottom, a photoresist layer 32', an anti-reflective coating layer 30' and a second silicon gate 26"located upon the second gate dielectric 25b. The sequential patterning is undertaken using an appropriate plasma etch method to provide nominally straight sidewalls to the foregoing series of patterned layers. As disclosed above, fluorine containing etchant gas compositions are typically, but not exclusively, used for etching silicon containing dielectric materials and some metal materials. Chlorine containing etchant gas compositions are typically, but not exclusively, used for etching some other metal materials, as well as silicon materials.

Figure 7:
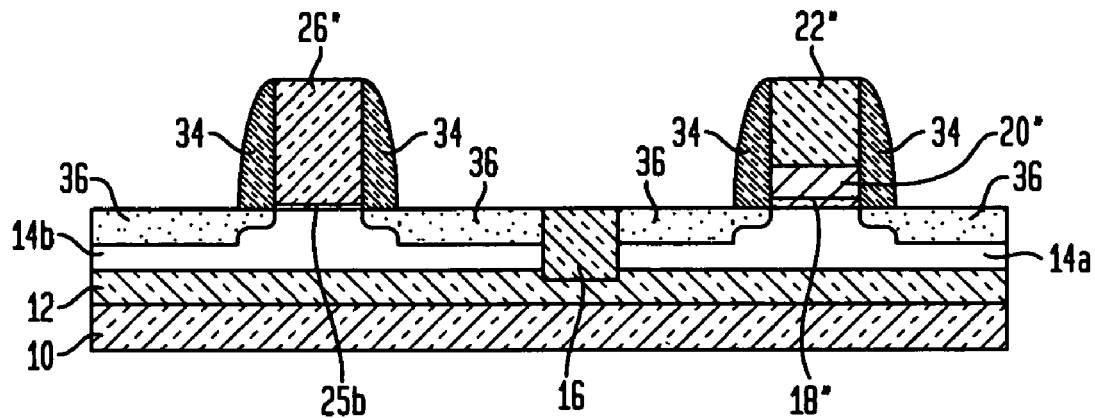

FIG. 7 first shows the results of an optional further etching of the first gate dielectric 18' to form the first gate dielectric 18" and the second gate dielectric 25b to form the second gate dielectric 25b'. This optional further etching is undertaken using plasma etch methods that use etchant gas compositions that are described above. Alternatively, wet chemical etch methods may also be used.

FIG. 7 also shows the results of stripping the photoresist layers 32', the anti-reflective coating layers 30' and the etch stop layer 25a' from the semiconductor structure whose schematic cross-sectional diagram is illustrated in FIG. 6. The photoresist layers 32', the anti-reflective coating layers 30 and the etch step layer 25a' may be stripped using methods and materials appropriate to the materials of composition thereof. Non-limiting examples include wet chemical methods and materials, dry plasma methods and materials and aggregate methods and materials thereof.

FIG. 7 finally shows spacers 34 adjoining sidewalls of: (1) the first gate dielectric 18", the first metal gate 20" and the first silicon gate 22"; and (2) the second gate dielectric 25b' and the second silicon gate 26". FIG. 7 also shows source/drain regions 36 located in the active region of the first orientation surface semiconductor surface layer 14a not covered by the first silicon gate 22" and the active region of the second orientation surface semiconductor surface layer 14b not covered by the second silicon gate 26".

The spacers 34 are illustrated in cross-section as two components with respect to each of the separate silicon gates 22" and 26". However, in plan-view spacers 34 comprise a single component with respect to a particular silicon gate 22" or 26". Spacers 34 may comprise materials and be formed using methods that are conventional in the semiconductor fabrication art. Spacers 34 typically comprise dielectric materials, although they may also comprise conductor materials. Non-limiting examples of dielectric materials include oxides, nitrides and oxynitrides of silicon. Oxides, nitrides and oxynitrides of other elements are not excluded. Spacers 34 are typically formed using a blanket layer deposition and anisotropic etchback method that provides the spacers 24 with the characteristic spacer shaped pointed tip.

The source/drain regions 36 are formed using a two step ion implantation method. A first step within the two step method uses the first gate stack 22"/20"/18" or the second gate stack 26"/25b' as a mask absent the spacers 34 to form a series of extension regions into the first orientation surface semiconductor layer 14a and the second orientation surface semiconductor layer 14b. The second step within the two step ion implantation method uses the first gate stack 22"/20"/18" and the spacer 34 or the second gate stack 26"/25b and the spacer 34 as a mask to form contact region portions of source/drain regions 36 that incorporate extension region portions of the source/drain regions 36. The ion implantation uses a different polarity for the transistor that uses the first gate stack 22"/20"/18" in comparison with the second transistor that uses the second gate stack 26"/25b'. Typically, dopant concentrations range from about 1e15 to about 1e21 dopant atoms per cubic centimeter within source/drain regions 36.

FIG. 7 shows a schematic cross-sectional diagram of a CMOS structure fabricated in accordance with a first embodiment of the invention. The CMOS structure comprises a first transistor that comprises a first silicon gate 22" located upon a first metal gate 20", in turn located upon a first gate dielectric 18" that is finally located upon a first orientation surface semiconductor layer 14a. The CMOS structure also comprises a second transistor (of polarity different and typically opposite the first transistor) that comprises a second silicon gate 26"located upon a second gate dielectric 25b', in turn located upon a second orientation surface semiconductor layer 14b.

A method for fabricating the CMOS structure that is illustrated in FIG. 7 uses an etch stop layer 25a located upon a first gate stack 22'/20'/18' that comprises a first silicon gate material layer 22' located over a first orientation surface semiconductor layer 14a (i.e., FIG. 3). A second silicon gate material layer 26 and a planarizing layer 28 are sequentially layered upon the etch stop layer 25a and a second dielectric layer 25b located over a second orientation surface semiconductor layer 14b (i.e., FIG. 3). Within the instant embodiment, the planarizing layer 28 and the second silicon gate material layer 26 are etched non-selectively while using the etch stop layer 25a as an etch indicator layer to provide the second silicon gate material layer 26' of height approximating the first silicon gate material layer 22' (i.e., FIG. 4).

FIG. 8 to FIG. 15 show a series of schematic cross-sectional diagrams illustrating the results of progressive stages in fabricating a CMOS structure in accordance with another embodiment of the invention. This other embodiment of the invention comprises a second embodiment of the invention.

Figure 8:
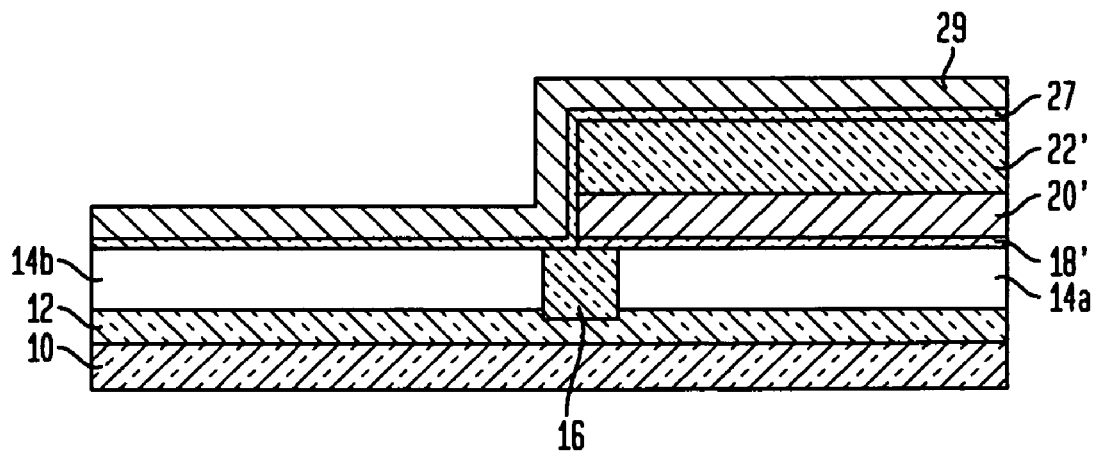
FIG. 8 to FIG. 16 show a series of schematic cross-sectional diagrams illustrating the results of progressive stages in fabricating a CMOS structure in accordance with another embodiment of the invention.

FIG. 8 shows a CMOS structure that derives from the CMOS structure of FIG. 2 within the first embodiment, with like or identical structures or layers being designated with like or identical reference numerals. More specifically, the CMOS structure of FIG. 8 derives from the CMOS structure of FIG. 2, but with the addition of a second gate dielectric 27 located upon the CMOS structure of FIG. 2, and in particular the second orientation surface semiconductor layer 14b and the first silicon gate material layer 22'. A second metal gate material layer 29 is located upon the second gate dielectric 27.

The second gate dielectric 27 may comprise a gate dielectric material selected from the same group of gate dielectric materials as the first gate dielectric 18 that is illustrated in FIG. 1. As disclosed above, the group includes generally higher dielectric constant dielectric materials having a dielectric constant from about 20 to at least about 100, and generally lower dielectric constant dielectric materials having a dielectric constant from about 4 to about 20. The first gate dielectric 18 and the second gate dielectric 27 may comprise either the same or different dielectric materials. For enhanced performance of a CMOS structure that results from further processing of the CMOS structure whose schematic cross-sectional diagram is illustrated in FIG. 8, each of the first gate dielectric 18 and the second gate dielectric 27 typically comprises a higher dielectric constant dielectric material such as a hafnium oxide or a hafnium silicate dielectric material. Typically, each of the first gate dielectric 18 and the second gate dielectric 27 has a thickness from about 20 to about 70 angstroms and is engineered to have a different composition to effect optimal CMOS performance. Performance may include, but is not limited to: threshold voltage and switching speed.

The second metal gate material layer 29 may similarly also be selected from the same group of metal gate materials as the first metal gate material layer 20 that is illustrated in FIG. 1. Typically, each of the first metal gate material layer 20 and the second metal gate material layer 29 will also comprise different metal gate materials. The different metal gate materials will typically be selected within the context of gate electrode work functions engineered for a first transistor that uses the first orientation surface semiconductor layer 14a as a channel, and a second transistor than uses the second orientation surface semiconductor layer 14b as a channel. Specific work functions and metal gate materials choices are readily determined by a person skilled in the art.

Figure 9:
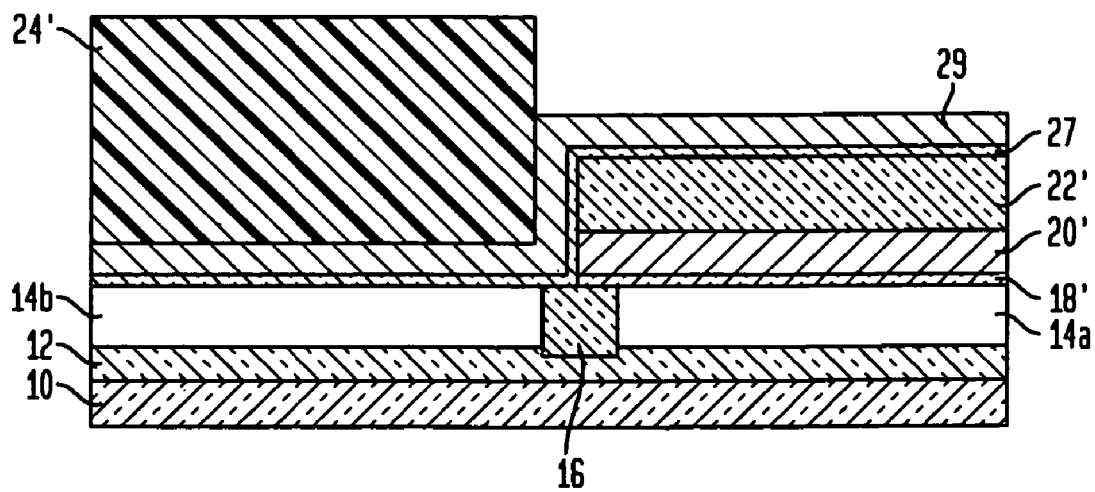

FIG. 9 shows a second block mask 24' otherwise analogous or equivalent to the first block mask 24 that is illustrated in FIG. 8, with the exception that the second block mask 24' is located over that second orientation surface semiconductor layer 14b rather than the first orientation semiconductor surface layer 14a.

Figure 10:
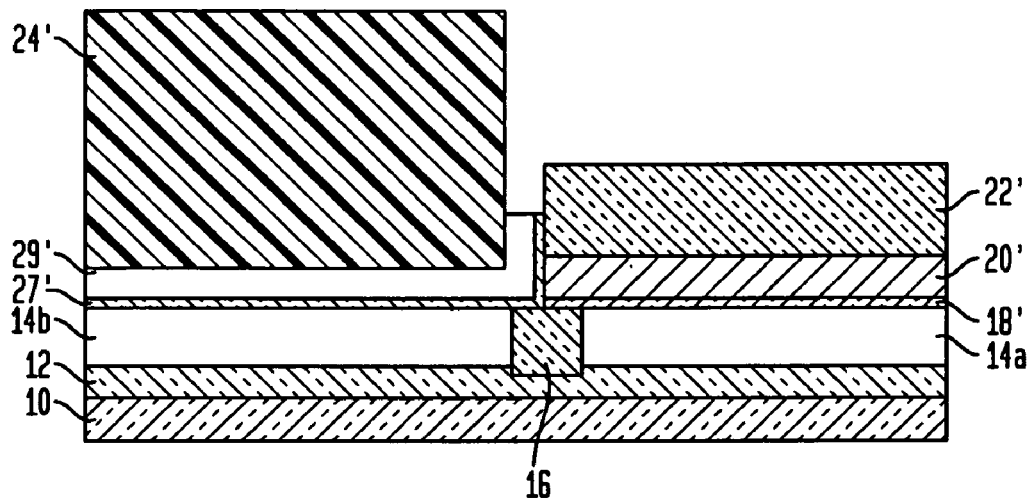

FIG. 10 shows the results of sequentially patterning the second metal gate material layer 29 and the second gate dielectric 27 to form a corresponding second metal gate material layer 29' and second gate dielectric 27' while using the block mask 24' as a mask. The foregoing sequential patterning is effected using methods and material similar to those used for forming the first gate 22'/20'/18' that is illustrated in FIG. 2 from the semiconductor structure that is illustrated in FIG. 1.

Figure 11:
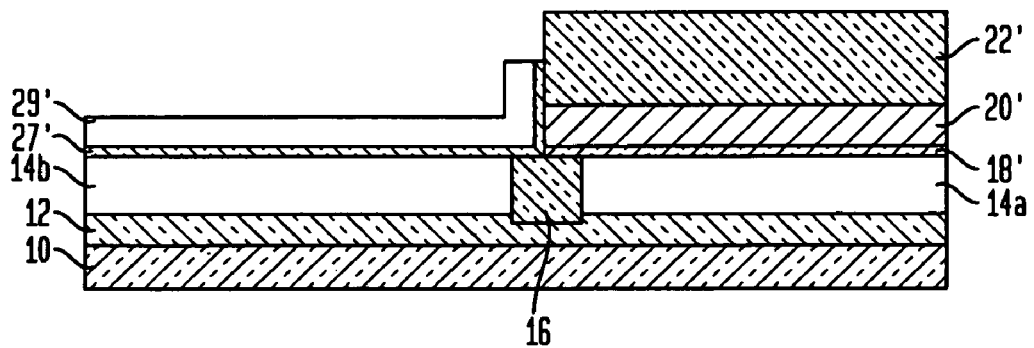

FIG. 11 shows the results of stripping the second block mask 24' from the second metal gate material layer 29' that is illustrated in FIG. 10. The second block mask 24' may be stripped using methods and materials analogous, equivalent or identical to the methods and materials used for stripping the first block mask 24 from the semiconductor structure that is illustrated in FIG. 1 to provide, in part, the semiconductor structure that is illustrated in FIG. 2.

Figure 12:
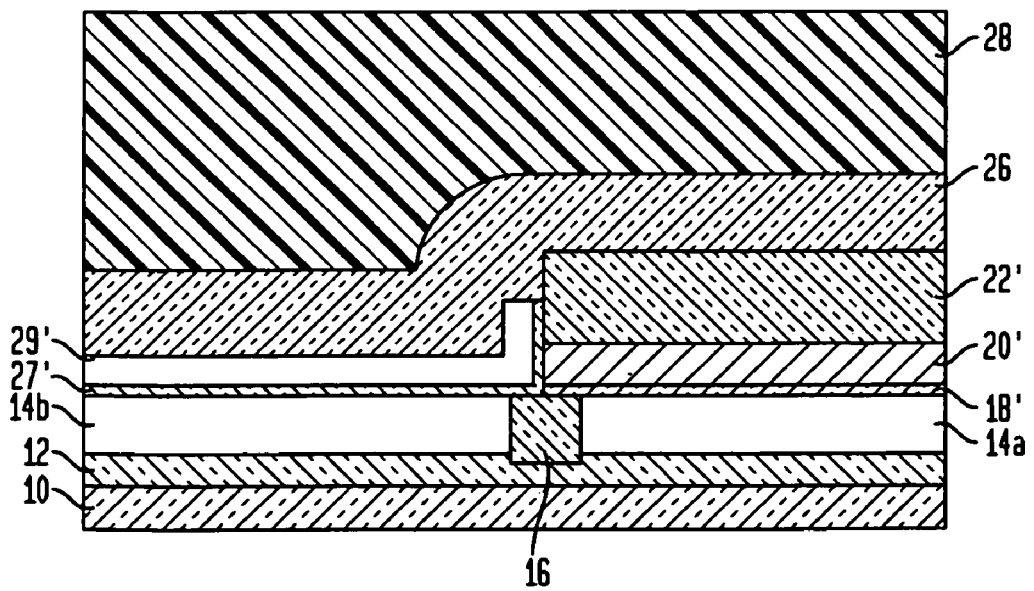

FIG. 12 shows the second silicon gate material layer 26 located upon the semiconductor structure of FIG. 11. FIG. 12 also shows the planarizing layer 28 located upon the second silicon gate material layer 26. FIG. 12 thus shows a schematic cross-sectional diagram of a semiconductor structure related to the semiconductor structure of FIG. 3, but with the absence of an etch stop layer 25a, and the presence of the second gate dielectric 27' and the second metal gate material layer 29' in place of the second gate dielectric 25b.

Figure 13:
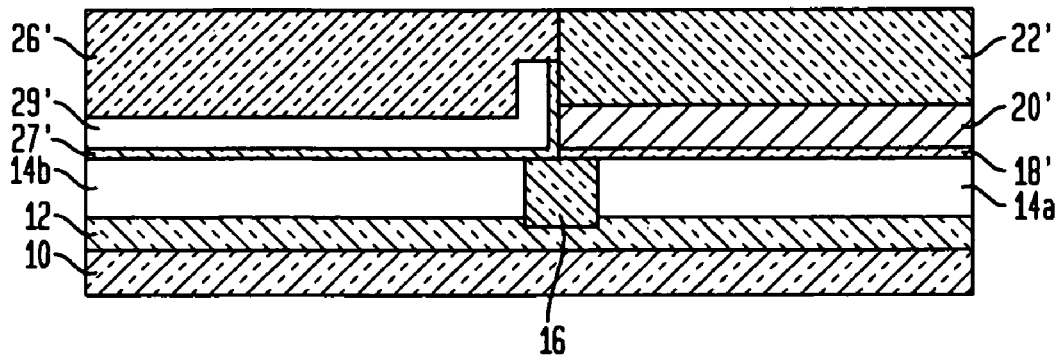

FIG. 13 shows the results of etching back the planarizing layer 28 and the second silicon gate material layer 26 that are illustrated in FIG. 12 to form the first silicon gate material layer 22" and the second silicon gate material layer 26'. Due to the absence of the etch stop layer 25a within the second embodiment, the first silicon gate material layer 22' is typically etched back to form the first silicon gate material layer 22". The etching back of the semiconductor structure whose schematic cross-sectional diagram is illustrated in FIG. 12 to provide the semiconductor structure whose schematic cross-sectional diagram is illustrated in FIG. 13 typically otherwise also uses a non-selective etchant with respect to the planarizing layer 28, the second silicon gate material layer 26 and the first silicon gate material layer 22". Further details of such a non-selective etchant are discussed above within the context of the first embodiment of the invention.

Figure 14:
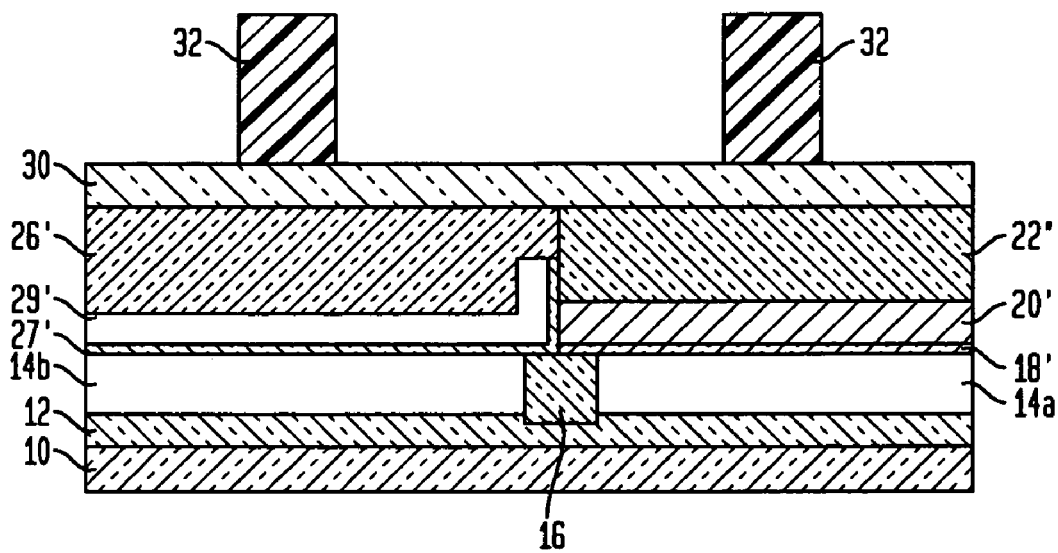

FIG. 14 shows the anti-reflective coating layer 30 located upon the semiconductor structure of FIG. 13. FIG. 14 also shows the photoresist layers 32 located upon the anti-reflective coating layer 30.

The anti-reflective coating layer 30 and the photoresist layers 32 are otherwise analogous, equivalent or identical to the anti-reflective coating layer 30 and the photoresist layers 32 that are illustrated in FIG. 5.

Figure 15:
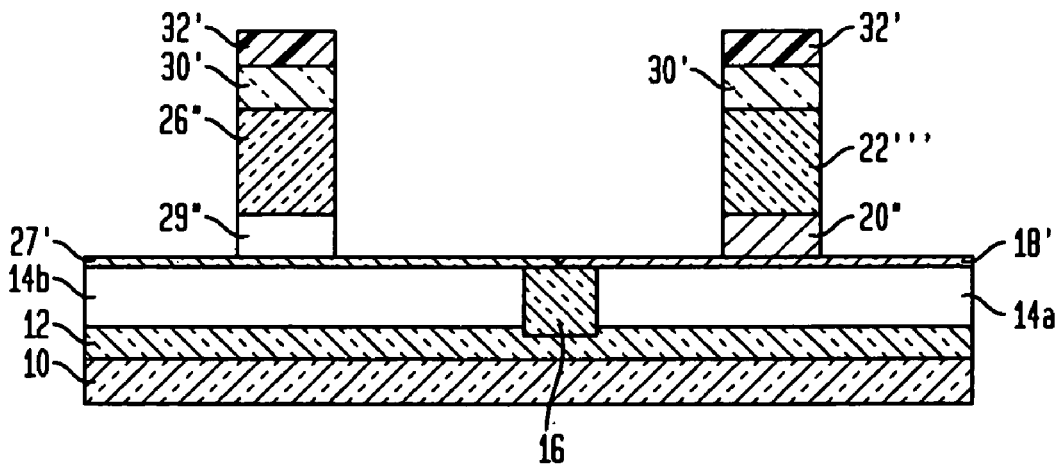

FIG. 15 shows patterning of gate stack layers 26"/29" and 22'''/20" that are illustrated in FIG. 14 analogous to corresponding patterning of corresponding layers that are illustrated in FIG. 5 to provide the semiconductor structure that is illustrated in FIG. 6.

Figure 16:
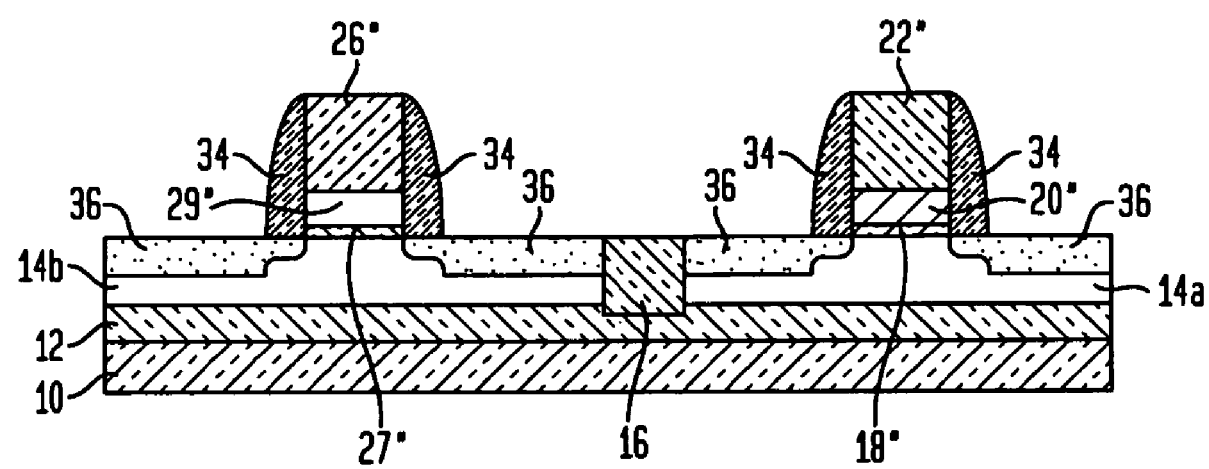

FIG. 16 shows the results of further processing of the semiconductor structure whose schematic cross-sectional diagram is illustrated in FIG. 15. FIG. 16 corresponds with FIG. 7, with the exception of the substitution of the second metal gate material layer 29" and the second gate dielectric 27" for the second gate dielectric 25b'.

FIG. 16 shows a schematic cross-sectional diagram of a semiconductor structure in accordance with a second embodiment of the invention. The CMOS structure correlates with the CMOS structure of the first embodiment that is illustrated in FIG. 7.

The CMOS structure of FIG. 16 is formed using the same non-selective etch back method that is used in forming the CMOS semiconductor structure whose schematic cross-sectional diagram is illustrated in FIG. 7. However, the etch back methodology utilized within the second embodiment does not use an etch stop layer such as the etch stop layer 25a that is illustrated in FIG. 3. Thus, the first silicon gate material layer 22" and the second silicon gate material layer 26' are etched back to the same thickness, and not necessarily a substantially similar thickness within about 10 to about 50 angstroms.

The invention thus provides, in part, an etch back method for forming a CMOS structure. The resulting CMOS structure may have: (1) a first orientation surface semiconductor layer 14a that differs in crystallographic orientation, composition and dopant polarity from a second orientation surface semiconductor layer 14b; (2) a first gate dielectric 18" that differs in composition and thickness from a second gate dielectric 27"; (3) a first metal gate 20" that differs in composition and thickness from a second metal gate 27"; and (4) a first silicon gate 22''' that differs in composition and thickness from a second silicon gate 26". The foregoing differences provide multiple opportunities for individually engineering performance for separate pFET and nFET transistors within the CMOS structure whose schematic cross-sectional diagram is illustrated in FIG. 16.

The preferred embodiments of the invention are illustrative of the invention rather than limiting of the invention. Revisions and modifications may be made to methods, materials, structures and dimensions of CMOS structures in accordance with the preferred embodiments of the invention while still providing CMOS structures in accordance with the invention, further in accordance with the accompanying claims.

What is claimed is:

1. A semiconductor structure comprising:
a first transistor located upon a semiconductor substrate, the first transistor comprising a first crystallographic orientation surface semiconductor layer, a first gate dielectric comprising a first dielectric material that directly contacts said first crystallographic orientation surface semiconductor layer, a first metal gate located thereupon and a first silicon gate located thereupon; and
a second transistor located upon the semiconductor substrate, the second transistor comprising a second crystallographic orientation surface semiconductor layer different than the first crystallographic orientation semiconductor surface layer, a second gate dielectric comprising a second dielectric material that directly contacts said second crystallographic orientation surface semiconductor layer, wherein said second dielectric material is different from said first dielectric material, a second metal gate located thereupon and a second silicon gate located thereupon, wherein each of the first metal gate and the second metal gate comprises a metal gate material selected from the group consisting of a metal and a metal nitride.

2. The semiconductor structure of claim 1 wherein the first metal gate and the second metal gate differ in at least one of composition and thickness.

3. The semiconductor structure of claim 1 wherein the first silicon gate and the second silicon gate differ in at least one of composition and thickness.

4. The semiconductor structure of claim 1 wherein:
the first transistor is an nFET and the first orientation is a (100) orientation; and
the second transistor is a pFET and the second orientation is a (110) orientation.

5. The semiconductor structure of claim 1 wherein said semiconductor substrate is a semiconductor-on-insulator and said first crystallographic orientation surface semiconductor layer and said second crystallographic orientation surface semiconductor layer are each located atop a dielectric layer and are separated by an isolation region that extends to said dielectric layer.

6. The semiconductor structure of claim 1 wherein said first crystallographic orientation surface semiconductor layer comprises a different semiconductor material than said second crystallographic orientation surface semiconductor layer.

7. The semiconductor structure of claim 5 wherein one of said first crystallographic orientation surface semiconductor layer or said second crystallographic orientation surface semiconductor layer is comprised of Si, and the other of said first crystallographic orientation surface semiconductor layer or said second crystallographic orientation surface semiconductor layer is comprised of SiGe.

8. The semiconductor structure of claim 1 wherein said first gate dielectric is a Hf oxide base based dielectric material, first metal gate material layer is TiN, and said first silicon gate is comprised of doped polysilicon.

9. The semiconductor structure of claim 1 wherein said second gate dielectric is comprised of one of an oxide of silicon, a nitride of silicon or an oxynitride of silicon.

10. The semiconductor structure of claim 1 wherein said first gate dielectric is a Hf-based gate dielectric and the second gate dielectric is an oxynitride of silicon.

11. A semiconductor structure comprising:
a first transistor located upon a semiconductor substrate, the first transistor comprising a first crystallographic orientation surface semiconductor layer, a first gate dielectric comprising a first dielectric material that directly contacts said first crystallographic orientation surface semiconductor layer, a first metal gate located thereupon and a first silicon gate located thereupon; and
a second transistor located upon the semiconductor substrate, the second transistor comprising a second crystallographic orientation surface semiconductor layer different than the first crystallographic orientation semiconductor surface layer, a second gate dielectric comprising a second dielectric material that directly contacts said second crystallographic orientation surface semiconductor layer, wherein said second dielectric material is different from said first dielectric material, a second metal gate located thereupon and a second silicon gate located thereupon, wherein each of the first metal gate and the second metal gate comprises a metal gate material selected from the group consisting of a metal and a metal nitride, and said first silicon gate is a different Si-containing conductive material than said second silicon gate.

12. The semiconductor structure of claim 1, wherein a bottom surface of said first metal gate vertically abuts a top surface of said first gate dielectric, and a bottom surface of said second metal gate vertically abuts a top surface of said second gate dielectric.

13. The semiconductor structure of claim 11, wherein a bottom surface of said first metal gate vertically abuts a top surface of said first gate dielectric, and a bottom surface of said second metal gate vertically abuts a top surface of said second gate dielectric.

* * * * *